US009196368B2

(12) United States Patent
Marotta et al.

(10) Patent No.: US 9,196,368 B2
(45) Date of Patent: Nov. 24, 2015

(54) ERASING PHYSICAL MEMORY BLOCKS OF NON-VOLATILE MEMORY

(71) Applicant: Round Rock Research, LLC, Parsippany, NJ (US)

(72) Inventors: Giulio Marotta, Contigliano (IT); Luca De Santis, Avezzano (IT); Tommaso Vali, Sezze (IT)

(73) Assignee: Round Rock Research, LLC, Parsippany, NJ (US)

( * ) Notice: Subject to any disclaimer, the term of this patent is extended or adjusted under 35 U.S.C. 154(b) by 0 days.

(21) Appl. No.: 14/159,041

(22) Filed: Jan. 20, 2014

(65) Prior Publication Data
US 2014/0133226 A1    May 15, 2014

Related U.S. Application Data

(60) Division of application No. 13/846,638, filed on Mar. 18, 2013, now Pat. No. 8,667,215, which is a continuation of application No. 12/269,766, filed on Nov. 12, 2008, now Pat. No. 8,407,400.

(51) Int. Cl.
G06F 12/00 (2006.01)
G11C 16/16 (2006.01)
G06F 12/02 (2006.01)

(52) U.S. Cl.
CPC ............ G11C 16/16 (2013.01); G06F 12/0246 (2013.01); G06F 2212/7202 (2013.01); G11C 2211/5641 (2013.01)

(58) Field of Classification Search
None
See application file for complete search history.

(56) References Cited

U.S. PATENT DOCUMENTS

| 5,237,689 A | 8/1993 | Behnke |
| 5,764,568 A | 6/1998 | Chevallier |
| 5,930,167 A | 7/1999 | Lee et al. |
| 6,147,912 A | 11/2000 | Kitazawa |
| 6,167,482 A | 12/2000 | Scmidt et al. |
| 6,175,937 B1 | 1/2001 | Norman et al. |
| 6,349,395 B2 | 2/2002 | Ohuchi |
| 6,363,008 B1 | 3/2002 | Wong |

(Continued)

FOREIGN PATENT DOCUMENTS

| EP | 0 802 540 | 10/1997 |
| WO | WO 99/50853 | 10/1999 |
| WO | WO 2006/013529 | 2/2006 |

OTHER PUBLICATIONS

Obr, et al. "Non Volatile Cache Command Proposal for ATA8-ACS" Microsoft Corporation, Apr. 1, 2005, pp. 1-37 (Revision 1).

(Continued)

Primary Examiner — Brian Peugh
(74) Attorney, Agent, or Firm — Lerner, David, Littenberg, Krumholz & Mentlik, LLP

(57) ABSTRACT

Apparatus and methods are disclosed, such as those that provide dynamic block allocations in NAND flash memory between single-level cells (SLC) and multi-level cells (MLC) based on characteristics. In one embodiment, a memory controller dynamically switches between programming and/or reprogramming blocks between SLC mode and MLC mode based on the amount of memory available for use. When memory usage is low, SLC mode is used. When memory usage is high, MLC mode is used. Dynamic block allocation allows a memory controller to obtain the performance and reliability benefits of SLC mode while retaining the space saving benefits of MLC mode.

19 Claims, 10 Drawing Sheets

(56) References Cited

U.S. PATENT DOCUMENTS

| | | |
|---|---|---|
| 6,452,859 B1 | 9/2002 | Shimano et al. |
| 6,466,476 B1 | 10/2002 | Wong et al. |
| 6,487,116 B2 | 11/2002 | Khan et al. |
| 6,536,038 B1 | 3/2003 | Ewertz et al. |
| 6,538,953 B2 | 3/2003 | Hidaka |
| 6,542,909 B1 | 4/2003 | Tamer et al. |
| 6,640,262 B1 | 10/2003 | Uppunda |
| 6,662,285 B1 | 12/2003 | Douglass |
| 6,785,767 B2 | 8/2004 | Coulson |
| 6,847,550 B2 | 1/2005 | Park |
| 6,943,404 B2 | 9/2005 | Huang et al. |
| 6,944,081 B2 | 9/2005 | Takahashi et al. |
| 6,983,428 B2 | 1/2006 | Cernea |
| 6,987,694 B2 | 1/2006 | Lee |
| 7,240,180 B2 | 7/2007 | Forrer et al. |
| 7,254,671 B2 | 8/2007 | Haswell |
| 7,275,190 B2 | 9/2007 | Roohpavar |
| 7,460,398 B1 | 12/2008 | Roohpavar et al. |
| 7,518,914 B2 | 4/2009 | Han |
| 7,558,113 B2 | 7/2009 | Kawamoto et al. |
| 7,650,541 B2 | 1/2010 | Roohpavar |
| 7,865,664 B2 | 1/2011 | Mori et al. |
| 7,916,536 B2 | 3/2011 | Roohpavar et al. |
| 8,000,166 B2 | 8/2011 | Kim et al. |
| 8,006,166 B2 | 8/2011 | Roohparvar et al. |
| 8,060,719 B2 | 11/2011 | Radke et al. |
| 8,281,061 B2 | 10/2012 | Radke et al. |
| 8,407,400 B2 | 3/2013 | Marotta et al. |
| 8,667,215 B2 | 3/2014 | Marotta et al. |
| 2001/0038553 A1 | 11/2001 | Parker et al. |
| 2002/0057595 A1 | 5/2002 | Kobayashi et al. |
| 2003/0018861 A1 | 1/2003 | Micheloni et al. |
| 2003/0217323 A1 | 11/2003 | Guterman et al. |
| 2005/0086574 A1 | 4/2005 | Fackenthal |
| 2005/0273548 A1 | 12/2005 | Roohpavar |
| 2005/0273549 A1 | 12/2005 | Roohpavar |
| 2006/0098484 A1 | 5/2006 | Roohpavar |
| 2007/0061502 A1 | 3/2007 | Lasser et al. |
| 2007/0168840 A1 | 7/2007 | Roohpavar |
| 2008/0055984 A1 | 3/2008 | Nazarian |
| 2008/0077728 A1 | 3/2008 | Kim et al. |
| 2008/0082735 A1 | 4/2008 | Shiga |
| 2008/0109703 A1 | 5/2008 | Brandman et al. |
| 2008/0126680 A1 | 5/2008 | Lee et al. |
| 2008/0215800 A1 | 9/2008 | Lee et al. |
| 2008/0232158 A1 | 9/2008 | Lamorey et al. |
| 2008/0301532 A1 | 12/2008 | Uchikawa et al. |
| 2008/0310225 A1 | 12/2008 | Roohpavar |
| 2008/0316815 A1 | 12/2008 | Lin |
| 2009/0043831 A1 | 2/2009 | Antonopoulos et al. |
| 2009/0113115 A1 | 4/2009 | Nazarian et al. |
| 2009/0129146 A1 | 5/2009 | Sarin et al. |
| 2009/0150596 A1 | 6/2009 | Cheng |
| 2009/0259799 A1 | 10/2009 | Wong |
| 2009/0300269 A1 | 12/2009 | Radke et al. |

OTHER PUBLICATIONS

Chang, Li-Pin, "Hybrid Solid-State Disks: Combining Heterogeneous NAND Flash in Large SSDs", Asia and South Pacific Design Automation Conference (ASPDAC), IEEE Mar. 21-24, 2008, pp. 428-433.

Tables, Modules or Data Structures in Memory

Block allocation Table 210

| Logical Block Address 212 | Physical Block 214 | Physical Block 216 | Mode 218 |
|---|---|---|---|
| 0 | Block 1 | Block 2 | SLC |
| 1 | Block 3 | Block 4 | SLC |
| 2 | Block 5 | Block A (unused) | MLC |
| 3 | Block 6 | Block 7 | SLC |
| 4 | Block 8 | Block B (unused) | MLC |
| 5 | Block C (unused) | Block D (unused) | Available |
| ... | ... | ... | ... |
| 4095 | Block 9 | Block 10 | SLC |

FIG. 2A

Available Blocks Table 220

| Number of Available Blocks 222 | Physical Location of Available Blocks 224 |
|---|---|
| N | Block A, Block B,... $B_{N-1}$, $B_N$ |

FIG. 2B

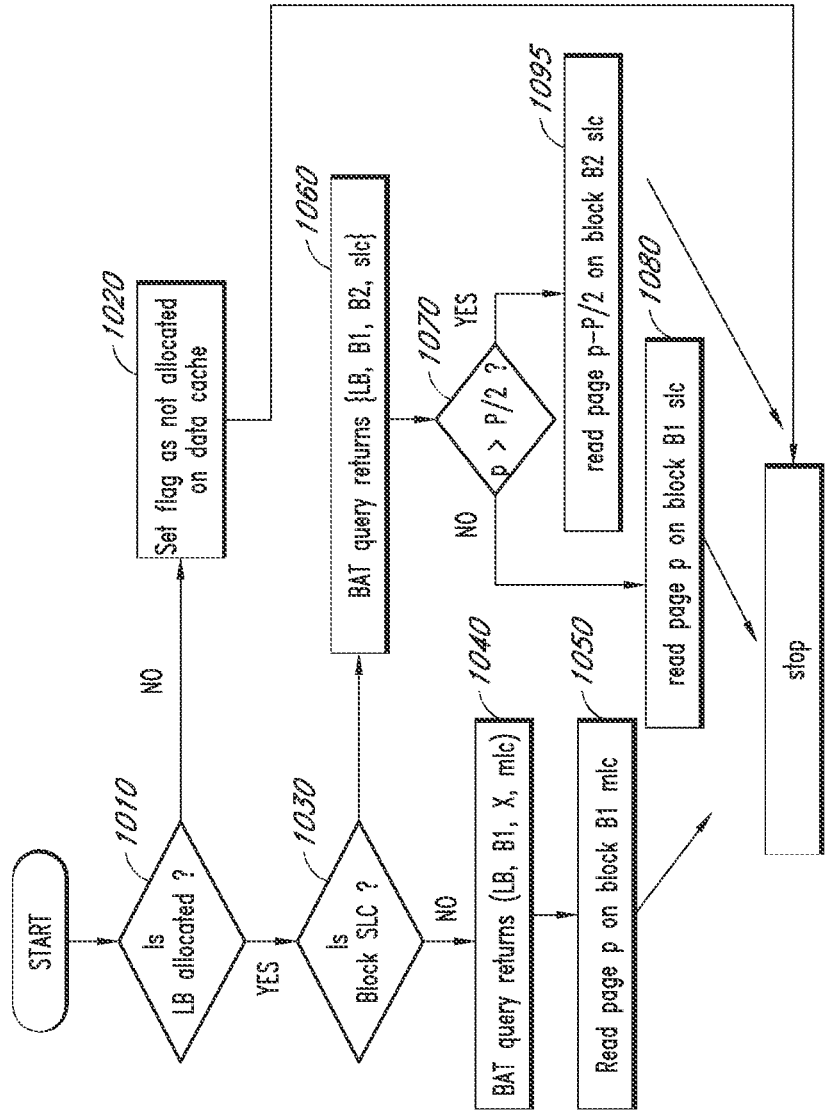

ERASING PHYSICAL MEMORY BLOCKS OF NON-VOLATILE MEMORY

REFERENCE TO RELATED APPLICATIONS

This application is a divisional of U.S. patent application Ser. No. 13/846,638, filed Mar. 18, 2013, titled "DYNAMIC SLC/MLC BLOCKS ALLOCATIONS FOR NON-VOLATILE MEMORY," which is a continuation of U.S. patent application Ser. No. 12/269,766, filed Nov. 12, 2008, titled "DYNAMIC SLC/MLC BLOCKS ALLOCATIONS FOR NON-VOLATILE MEMORY," the disclosures of each which are hereby incorporated by reference in their entireties herein.

BACKGROUND

1. Field of the Invention

One or more embodiments of the invention generally relate to memory, and in particular to non-volatile solid-state memory.

2. Description of the Related Art

Flash memory is a quickly growing industry. Example applications include PDAs, laptop computers, digital audio players, digital cameras, cell phones, and video game consoles. Flash memory has certain advantages over other types of memories. For example, flash memories have fast read access times, good durability, strong kinetic shock resistance, a wide temperature range, good resistance to pressure and water, and requires no power to retain information. As a result of these performance characteristics, flash memories are very popular in portable devices.

However, flash memories have performance limitations as well. For example, the endurance (for example, lifetime) of a flash memory is limited to a finite number of erase-write cycles. In addition, flash memory has better reliability when data is programmed in a block of single-level cells (SLC) (that is, cells programmed and/or erased to one of two states), compared to when data is programmed as a block of multi-level cells (MLC) having two or more levels (that is, bits) per cell.

BRIEF DESCRIPTION OF THE DRAWINGS

These drawings and the associated description herein are provided to illustrate embodiments and are not intended to be limiting.

FIG. 2A and FIG. 2B illustrate examples of tables of data structures for a memory controller.

FIG. 10 illustrates a process of reading data from a block.

DETAILED DESCRIPTION OF EMBODIMENTS

Figure 1:
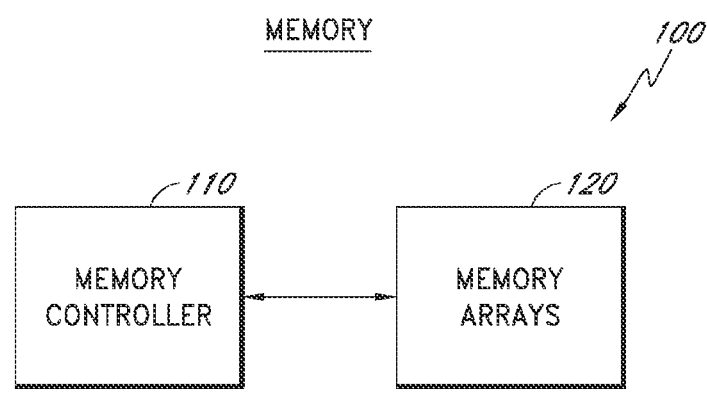
FIG. 1 illustrates a memory with a memory controller and one or more memory arrays.

Although particular embodiments are described herein, other embodiments of the invention, including embodiments that do not provide all of the benefits and features set forth herein, will be apparent to those of ordinary skill in the art.

In some embodiments of the invention, the mode of operation is dynamically determined and operates in the background without user invention. Memory performance can be improved by dynamically switching between two modes of operation (for example, SLC or MLC mode, two different MLC modes) based on memory characteristics. In one embodiment, a memory characteristic to determine the mode of operation is the amount of memory in use. In another embodiment, the memory characteristic is an amount of memory available for use.

Dynamic can mean run-time operations that occur in the background or in the foreground based on some characteristics (for example, memory usage). The determination can occur automatically, without a need for user intervention. Programming (for example, mapping) of blocks includes programming new data into blocks in SLC or MLC mode and includes reprogramming (for example, remapping) existing data between SLC and MLC blocks.

As a result of the dynamic determination, at least the following enhanced performances can be achieved: speed, reliability, and enhanced lifetime. Cells programmed in SLC mode are programmed faster, more reliably, and have a longer lifetime than cells programmed in MLC mode. However, twice as many cells are needed for SLC than for two-level MLC (that is, a mode wherein cells can be programmed and/or erased to one of four data states) for a given amount of data. Despite this, it can be desirable to operate a cell in SLC mode to retain the performance advantages of SLC rather than to automatically operate in MLC mode. One way to accomplish this performance advantage is by having a memory controller operate a memory cell in SLC mode until the memory usage exceeds a threshold (for example, a level, amount, or percentage).

A threshold level can be set to one or more possible levels. For simplicity, a 50% threshold embodiment and a two-level MLC is chosen to discuss in more detail. In the 50% of memory capacity embodiment, a controller can write information into memory in SLC mode as long as the memory usage is less than half (that is, less than half of the memory is in use). After reaching or exceeding 50% of memory capacity, the memory controller can switch and write information into memory in MLC mode. This is advantageous because a two-level MLC block takes up half as many cells as a SLC block.

In another embodiment, upon nearing 50% of maximum memory MLC capacity, the memory controller can begin to compact existing data. Compacting existing data, at least according to one embodiment, involves the re-programming of data from SLC to MLC. Compaction will be described in greater detail later in connection with FIG. 7. In other words, two physical blocks of SLC data can be combined into one physical block of two-level MLC, without any loss of data.

In another embodiment, as memory usage drops below 50% (that is, less than half of a capacity of the memory is in use), the memory controller can relax (for example, un-compact) existing MLC data. Relaxation will be described in greater detail later in connection with FIG. 9. Relaxing existing data, according to at least one embodiment, involves re-programming cells from MLC to SLC. In other words, data from one physical block of MLC can be programmed into two physical blocks of SLC data, without any loss of data.

FIG. 1 illustrates a memory 100 with a memory controller 110 and one or more memory arrays 120. The memory controller 110 can be incorporated into a controller, system controller, memory chip controller, system card controller, or the like. The memory controller 110 can be integrated with the memory array 120 or external to the memory 100. The memory controller 110 controls the allocation, reading, writing, programming, reprogramming, compacting, and relaxation of the memory array 120. In addition, the memory controller 110 can determine the mode of operation (for example, SLC or MLC) and remaining lifetime of each of the blocks of cells.

Flash memories can be NOR type or NAND type. While illustrated in the context of NAND flash, the principles and advantages are applicable to NOR flash as well. NAND flash memory is a non-volatile computer memory that can be electrically programmed (that is, written to), read, erased, and reprogrammed. Flash memory can be used for general storage or for temporary storage. In some embodiments, flash memory is used in mass storage, memory cards, digital cameras, digital audio devices, and USB storage devices such as USB thumb drives.

FIG. 2A and FIG. 2B illustrate examples of tables 210, 220 for the memory controller 110. FIG. 2A illustrates an example of a block allocation table 210. In FIG. 2A, the first column 212 lists logical block addresses from zero to 4095. Thus, there are 4096 logical block addresses for the particular memory array. In the second 214 and third 216 columns, one or more corresponding physical blocks are shown for the logical block address. In the fourth column 218, the corresponding mode is shown. Since a two-level MLC block stores twice the data per cell as compared to an SLC block, only one physical MLC block per row is shown, compared to two physical SLC blocks per row. After the blocks are allocated, a logical block implemented with SLC occupies twice as many cells as a logical block implemented with two-level MLC.

In one embodiment, the threshold is about 50% of maximum MLC memory capacity. In another embodiment, the threshold is in a range between 25% and 50% of maximum memory capacity. Other thresholds will be readily determined by one of ordinary skill in the art. In another embodiment, the threshold is set above the user's average memory use. In other embodiments, the threshold for switching from SLC to MLC, and MLC to SLC, are different thresholds to prevent constant switching back and forth if the memory usage hovers around the threshold. By setting an appropriate threshold, the memory controller can program data for a longer period of time in SLC mode, and retain the performance and reliability advantages. For example, a user that rarely exceeds 50% of maximum memory capacity, can benefit from a threshold level around 50%, so the user can benefit from the advantages of SLC mode.

In FIG. 2B, an example of an available blocks table 220 is shown. Available blocks table 220 stores information about physical blocks. In the first column 222, the number of available blocks is represented by N. An available block can correspond to a block that is currently free for use. An available block can be erased right before it is used. In the second column 224, the physical location of a block is stored. For example, the memory controller 110 can determine the physical location of the memory that is available (for example, free, empty, not in use) for writing, such as on, for example, a solid state disk. As discussed above, in one embodiment, the memory controller dynamically operates in the background by programming or reprogramming data in SLC or MLC mode based on memory usage.

Figure 3:
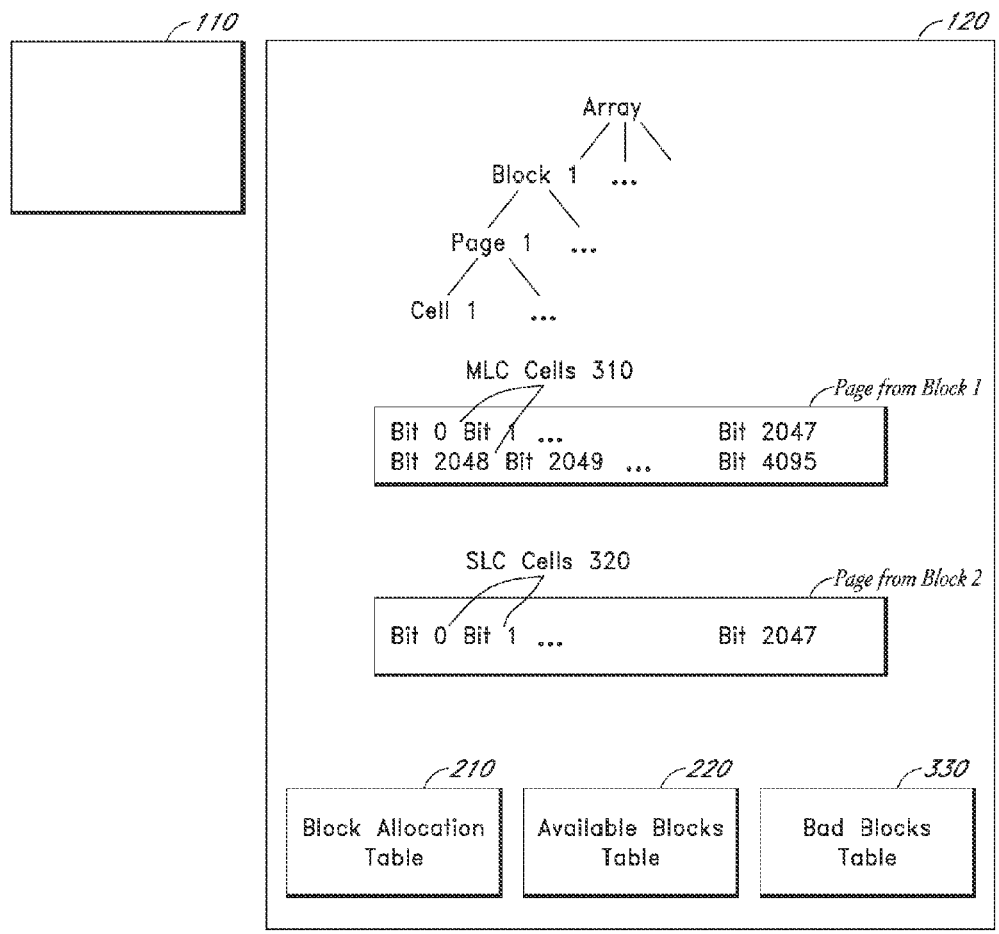
FIG. 3 illustrates data structures and SLC/MLC blocks inside the memory.

FIG. 3 illustrates two pages of cells for the memory array 120. Pages from block 1 have cells 310 in MLC mode, each having two bits per cell. Pages from block 2 have cells 320 in SLC mode, each having one bit per cell. FIG. 3 also illustrates data structures 210, 220, and 330 inside the memory array 120.

A block allocation table 210 is coupled to the memory controller 110 so that the memory controller 110 can manage the block allocation table 210. The block allocation table 210 contains rows with a logical block address, along with the physical address for the corresponding one or two blocks associated with that logical block address. An available blocks table 220 is also used by the memory controller 110. The available blocks table 220 allows the memory controller 110 to keep track of the number of blocks that are available (for example, free, erased, unprogrammed). Also, the available blocks table 220 keeps track of the physical location of the blocks. A bad blocks table 330 stores blocks that should not be used The memory controller 110 can update the bad blocks table 330 when a block is discovered to be defective, and the memory controller 110 can check the bad blocks table before selecting a block for programming.

In FIG. 3, the memory controller 110 can operate, monitor, and control the data exchanged in the memory array 120. The memory controller 110 can work in the background without user invention. The memory controller 110 can automatically configure the operating modes for blocks (for example, SLC or MLC) for better reliability and performance.

A block in flash memory is the smallest physical unit that can be erased. A block is typically a fixed number of cells for a fixed amount of memory. However, since the cells can vary from SLC mode and MLC mode, the number of cells in a block can also vary. A block can have multiple pages. For example, a block with 16 kilobytes typically has 32 pages, whereas a block of 512 kB typically has 128 pages. A page size is typically 512 bytes, 2048 bytes, or 4096 bytes, but can vary.

Figure 4:
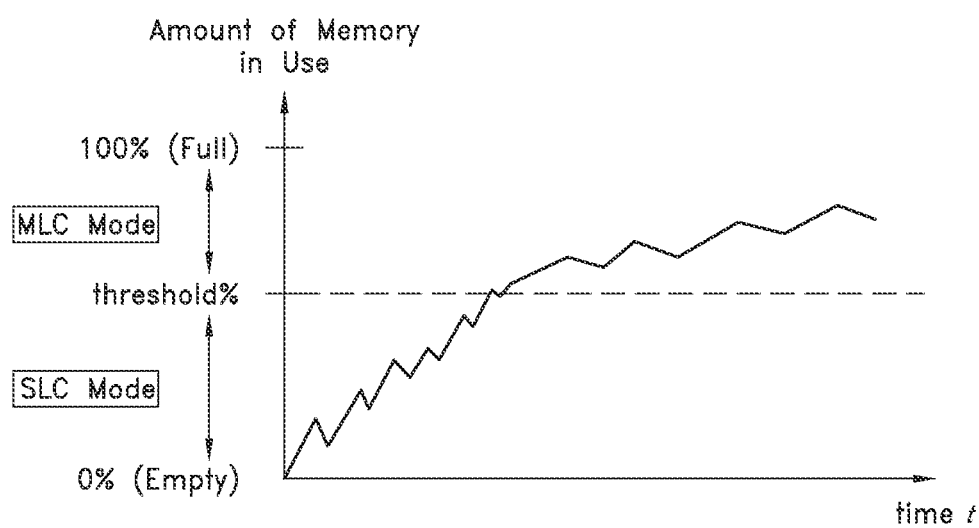
FIG. 4 illustrates an example of a graph of memory usage over time.

FIG. 4 illustrates a graph of an example of memory usage over time (for example, for a solid state drive). When the usage is less than a threshold, data is programmed in SLC mode. When usage is greater than or equal to the threshold, data is programmed in MLC mode.

Figure 5:
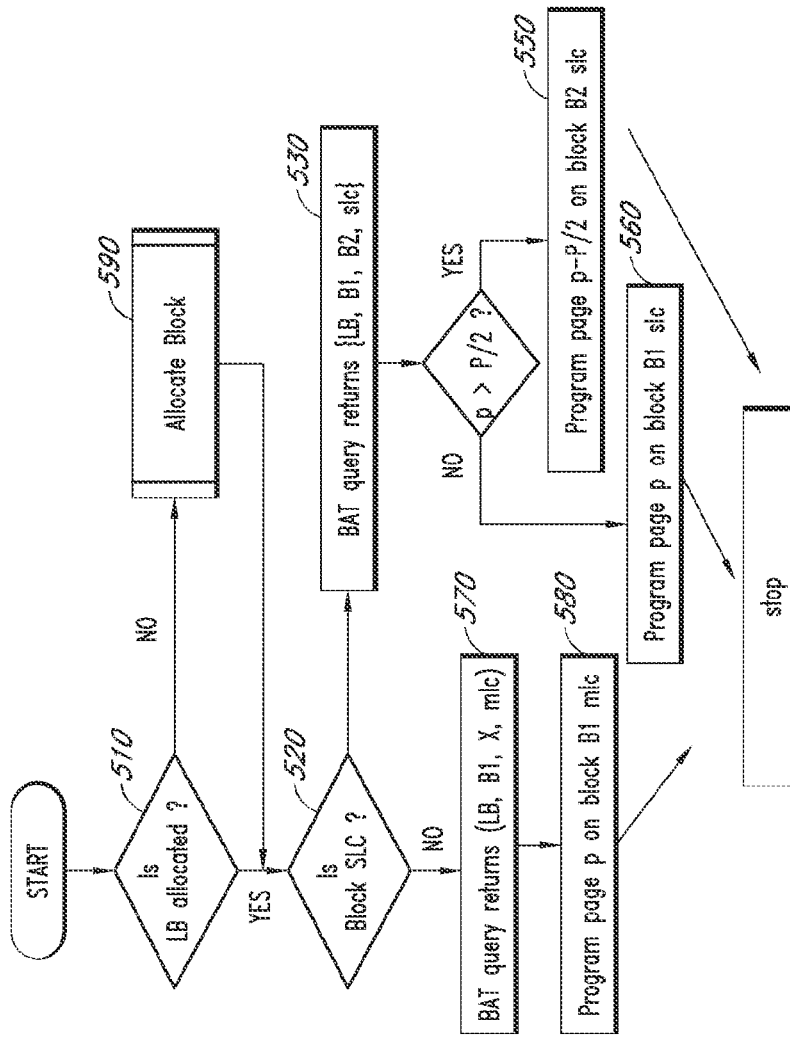
FIG. 5 illustrates a process of programming data to a block.

FIG. 5 illustrates a process for programming a page p of a logical block LB. It will be appreciated by the skilled practitioner that the illustrated process can be modified in a variety of ways. For example, in another embodiment, various portions of the illustrated process can be combined, can be rearranged in an alternate sequence, can be removed, or the like.

The process starts at a decision block 510, in which the process determines whether the logical block LB has already been allocated. If the block has already been allocated, the process proceeds from the decision block 510 to a decision block 520.

If the logical block LB has not yet been allocated, for example, no prior pages had been programmed to the logical block LB, the process proceeds from the decision block LB to a state 590 to allocate the logical block LB. A process for block allocation will be described in greater detail later in connection with FIG. 6. The process then advances from the state 590 to the decision block 520.

In the decision block 520, the process determines whether the logical block has been allocated in SLC mode or MLC mode. The mode can be determined by reading the block allocation table 210 (FIG. 2A) as shown in the state 530 or the state 570.

If the allocation is the SLC mode, the process proceeds to the state 530 with the query result for the logical block LB as illustrated in FIG. 5. The process advances from the state 530 to a decision block 540.

In the illustrated embodiment with a choice between SLC and two-level MLC, when a logical block is written in SLC mode, the data is spread among two physical blocks B1, B2 of SLC data. In the illustrated embodiment, the first half of the pages for the logical block LB are written in physical block B1, and the second half are written in physical block B2.

In the decision block 540, the process determines which block, B1 or B2, is programmed with the page of data. If the page number p is greater than half the total number of pages P in a logical block, the process proceeds from the decision block 540 to a state 550 to program the page of data on the block B2 on page p—P/2. The process then ends.

If the page number p is not greater than P/2, the process proceeds from the decision block 540 to a state 560 and programs the page of data on page p of block B1. After programming a page to block B1, the process then ends.

Returning now to the decision block 520, if the mode is MLC, the process proceeds from the decision block 520 to a state 570. As illustrated in the state 570, the query for the block allocation table 210 (FIG. 2A) returns a single block B1 as the corresponding physical block. The process advances from to the state 570 to the state 580 and programs the data to the p-th page, which may include multiple level data storage. The process then ends.

Figure 6:
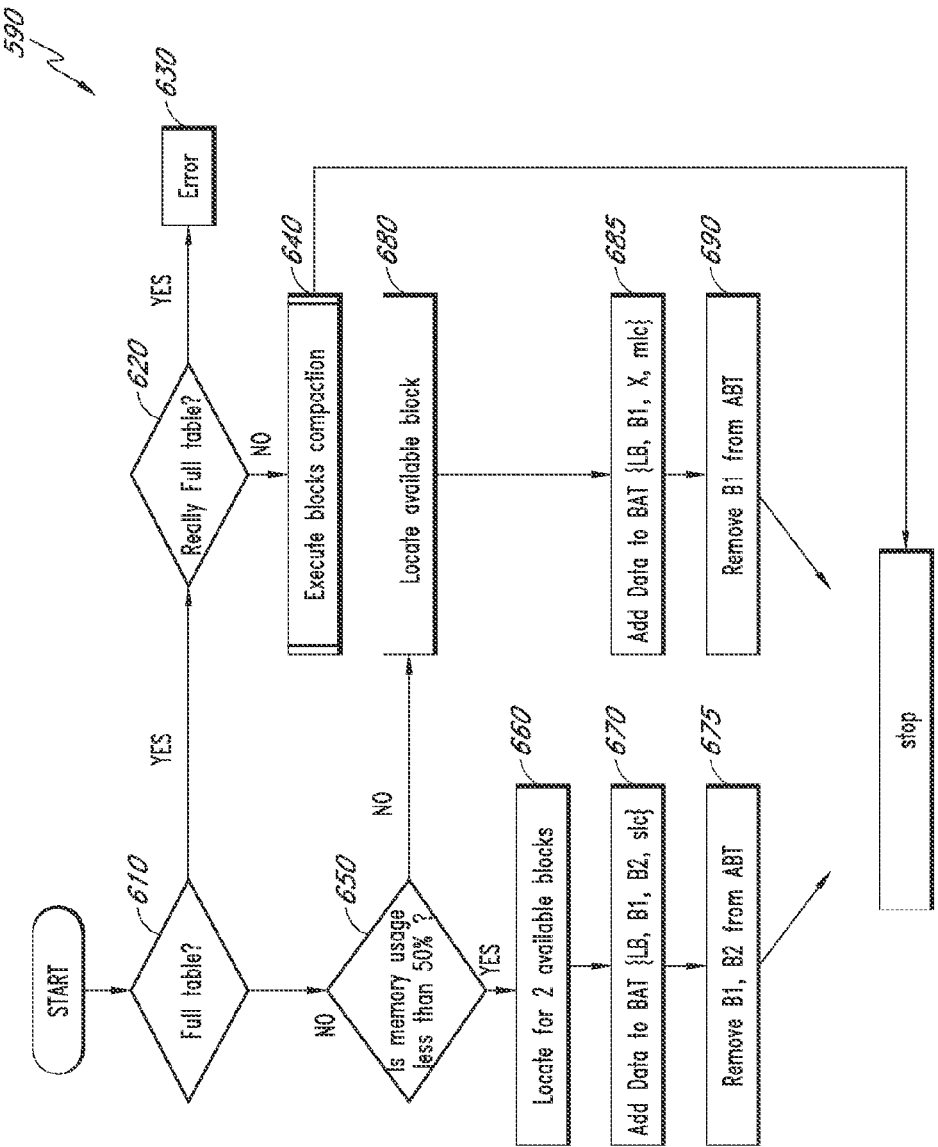
FIG. 6 illustrates a process of allocating blocks to a block allocation table.

FIG. 6 illustrates a process of allocating (for example, adding) a block. It will be appreciated by the skilled practitioner that the illustrated process can be modified in a variety of ways. For example, in another embodiment, various portions of the illustrated process can be combined, can be rearranged in an alternate sequence, can be removed, or the like.

The process begins at a decision block 610. At the decision block 610, the process determines if the block allocation table is full. Full can be defined as, for example, the block allocation table has no available blocks or few available blocks, but some of the blocks are written in SLC mode. If full, the process proceeds from the decision block 610 to a decision block 620. The process in decision block 620 determines if the block allocation is "really" full. Really full can be defined as, for example, the block allocation table has no available blocks and all blocks are written in MLC mode. When the block allocation is really full, the compaction operation is not possible because there are no SLC blocks to compact into MLC blocks. If decision block 620 indicates that the block allocation table is really full, the process proceeds to a state 630 and indicates that there is an error, because the memory is full and no blocks are available for use. If all blocks are programmed in MLC, the user will need to erase or lower memory usage to write new data. If decision block 620 indicates that there is one or more blocks that can be converted from SLC to MLC, the state 640 runs a block compaction algorithm (FIG. 7) converting SLC blocks to MLC blocks before the process ends or returns to the start of the block allocation process.

Returning now to the decision block 610, if the block allocation table is not full, the process proceeds to a decision block 650. At the decision block 650, the process determines if the memory usage is less than a 50% of maximum memory capacity. If yes, then the process proceeds from the decision block 650 to a state 660. In state 660, the process locates two available blocks to allocate in SLC mode. In the state 670, the process adds SLC blocks B1 and B2 to the block allocation table. Then, in state 675, the process removes those blocks from the available blocks table.

If in the decision block 650, the process determines that the memory usage is greater than or equal to 50% of maximum memory capacity, the process proceeds to a state 680, where the process locates one available block to allocate in MLC mode. Next, a state 685 adds the located MLC block to the block allocation table. Then, a state 690 removes that block from the available blocks table. The process then ends.

Figure 7:
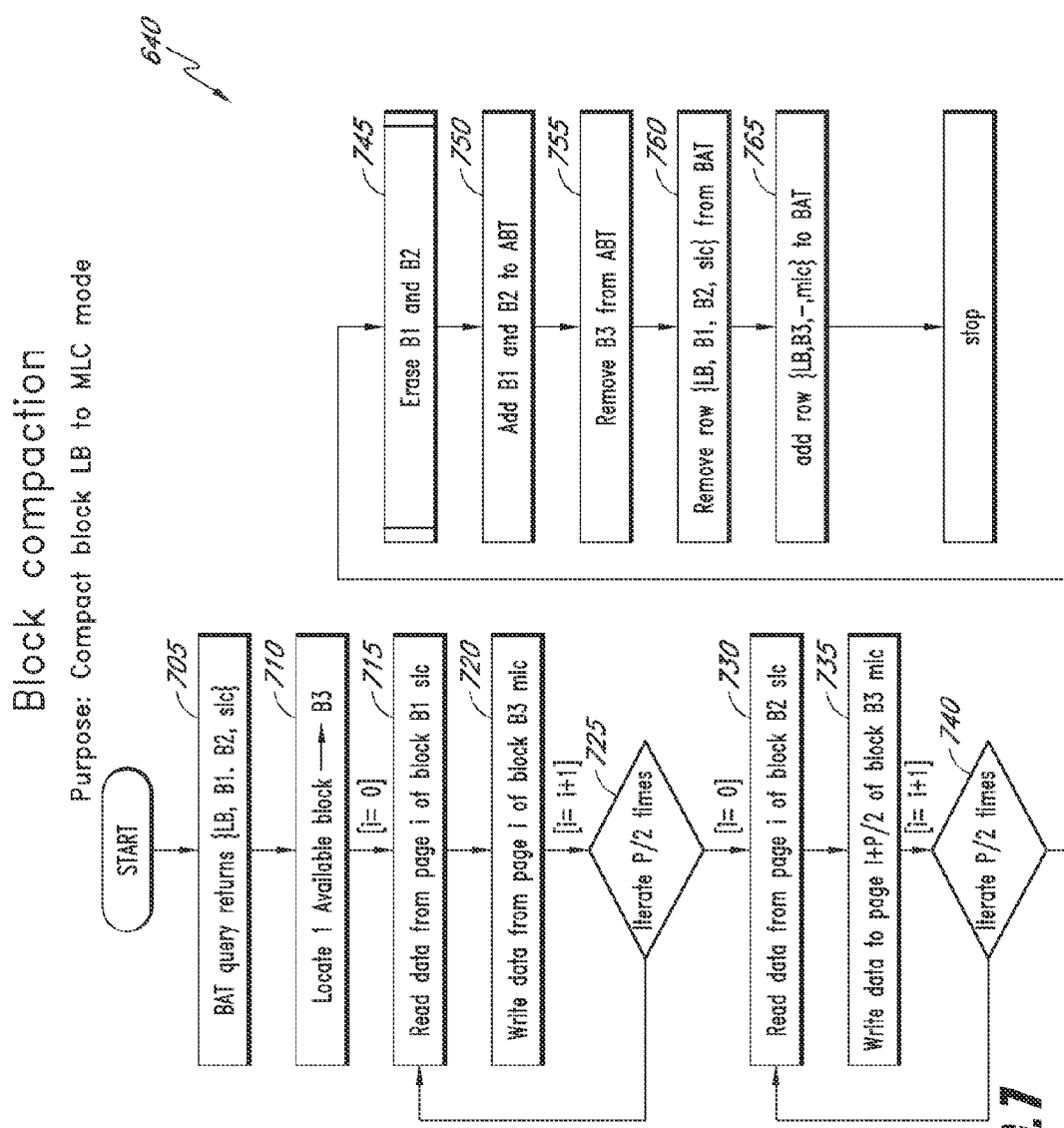
FIG. 7 illustrates a process of compacting existing blocks from SLC mode to MLC mode.

FIG. 7 illustrates further details of the state 640 from FIG. 6, and illustrates a process of compacting existing blocks from SLC mode to MLC mode. It will be appreciated by the skilled practitioner that the illustrated process can be modified in a variety of ways. For example, in another embodiment, various portions of the illustrated process can be combined, can be rearranged in an alternate sequence, can be removed, or the like.

This compaction can be used to save space by collapsing blocks after a memory usage exceeds a threshold. This procedure can combine two physical blocks written in SLC into one two-level MLC block. No data or information is lost in this compaction.

The process begins at a state 705, where the block allocation table returns the blocks B1 and B2 corresponding to the logical block which will be converted from SLC to MLC mode. In a state 710, the process finds an available block B3 for storage of data from SLC blocks B1 and B2. A loop counter i is initialized to zero. At state 715, the process reads the data from page i of block B1 in SLC mode. Then, in a state 720, the process writes this data from page i to block B3 in MLC mode. At decision block 725, the process iterates the read and write states 715, 720, for a total of P/2 iterations, where P is the total number of pages available in the logical block address corresponding to blocks B1 and B2.

Similar to states 715, 720, and decision block 725, states 730, 735, and decision block 740 repeat the process for block B2. The loop counter i is reset to zero. At the state 730, the process reads the data from page i of block B2 in SLC mode. Then, in the state 735, the process writes this data from page i to block B3 in MLC mode. At decision block 740, the process iterates the read and write states P/2 times, where P is the total number of pages available in the logic block address corresponding to blocks B1 and B2.

Next, the process erases blocks B1 and B2 from the block allocation table in a state 745 as will be discussed in greater details later in connection with FIG. 8. In a state 750, the process adds the erased blocks to the available blocks table. At a state 755, the process removes block B3 from the available blocks table. At a state 760, the process removes the logical block address row corresponding to blocks B1 and B2 from the block allocation table. At a state 765, the process adds a row to the block allocation table corresponding to the logical block address of block B3. The process then ends.

Figure 8:
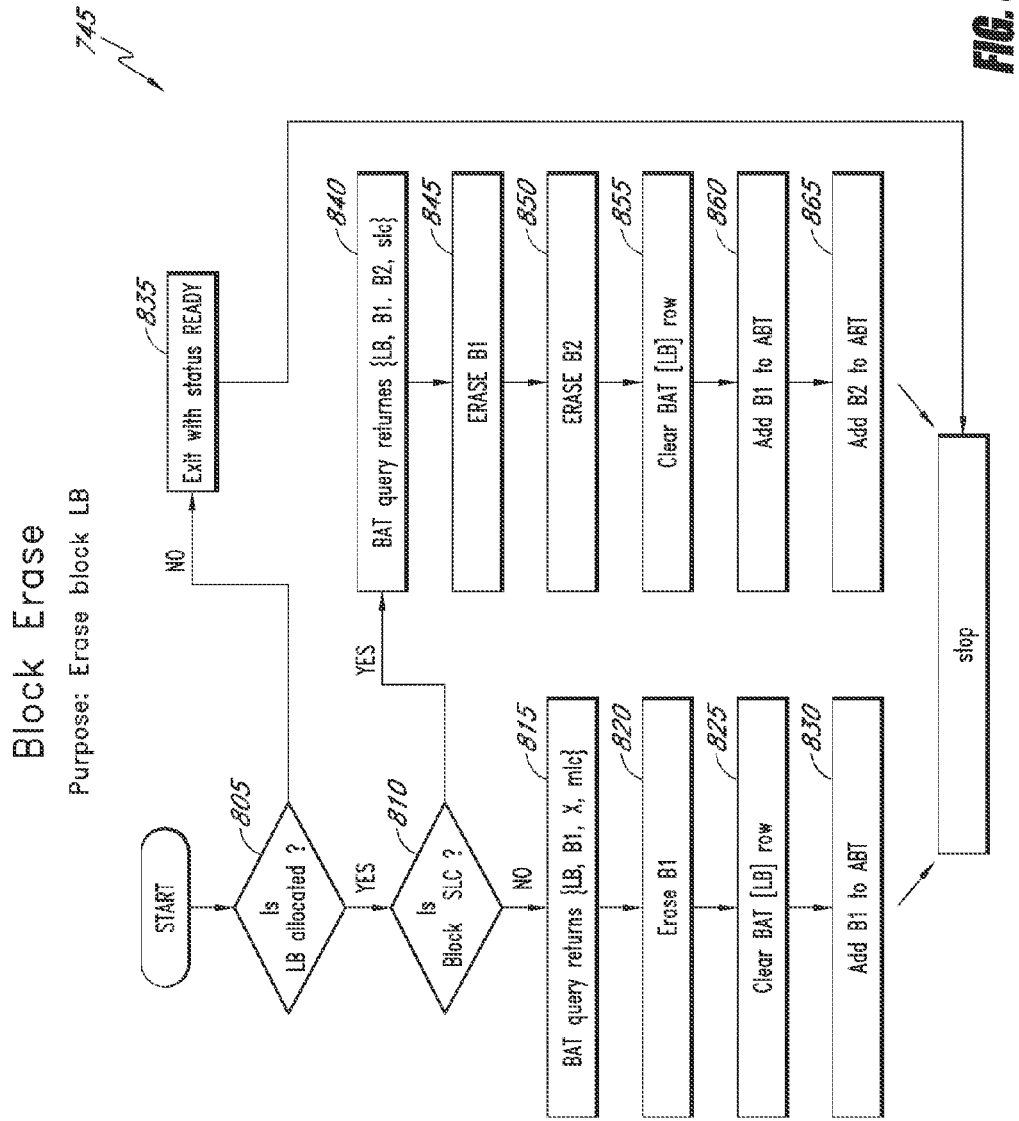
FIG. 8 illustrates a process of erasing data from a block.

FIG. 8 illustrates a process of erasing data from a logical block LB. It will be appreciated by the skilled practitioner that the illustrated process can be modified in a variety of ways. For example, in another embodiment, various portions of the illustrated process can be combined, can be rearranged in an alternate sequence, can be removed, or the like.

At a decision block 805, the process determines if the logical block is allocated. If the block is allocated, the process proceeds from the decision block 805 to a decision block 810, where the process determines if the block is an SLC or MLC block. If the process determines that the block is an MLC, then the process proceeds to a state 815, where the process queries the block allocation table for the physical block B1 information. Next, the process erases physical block B1 at a state 820. At a state 825, the process clears an indication (e.g., row) of the logical block from the block allocation table. At a state 830, the process adds the physical block B1 to the available blocks table and the process ends.

Returning now to the decision block 810, if the process determines that the logical block is in SLC mode, a process similar to states 815-830 is performed. At state 840, the process queries the block allocation table for the physical blocks B1 and B2. Next, the process erases blocks B1 from the memory at states 845 and 850, respectively. At a state 855, the process clears an indication (e.g., row) of the logical block from the block allocation table. At states 860 and 865, the process adds an indication of the physical blocks B1 and B2, respectively, to the available blocks table. The process then ends.

Returning now to the decision block 805, if the logical block is not allocated, the process exits with a status of "ready" to program data in state 835 and the process ends.

Figure 9:
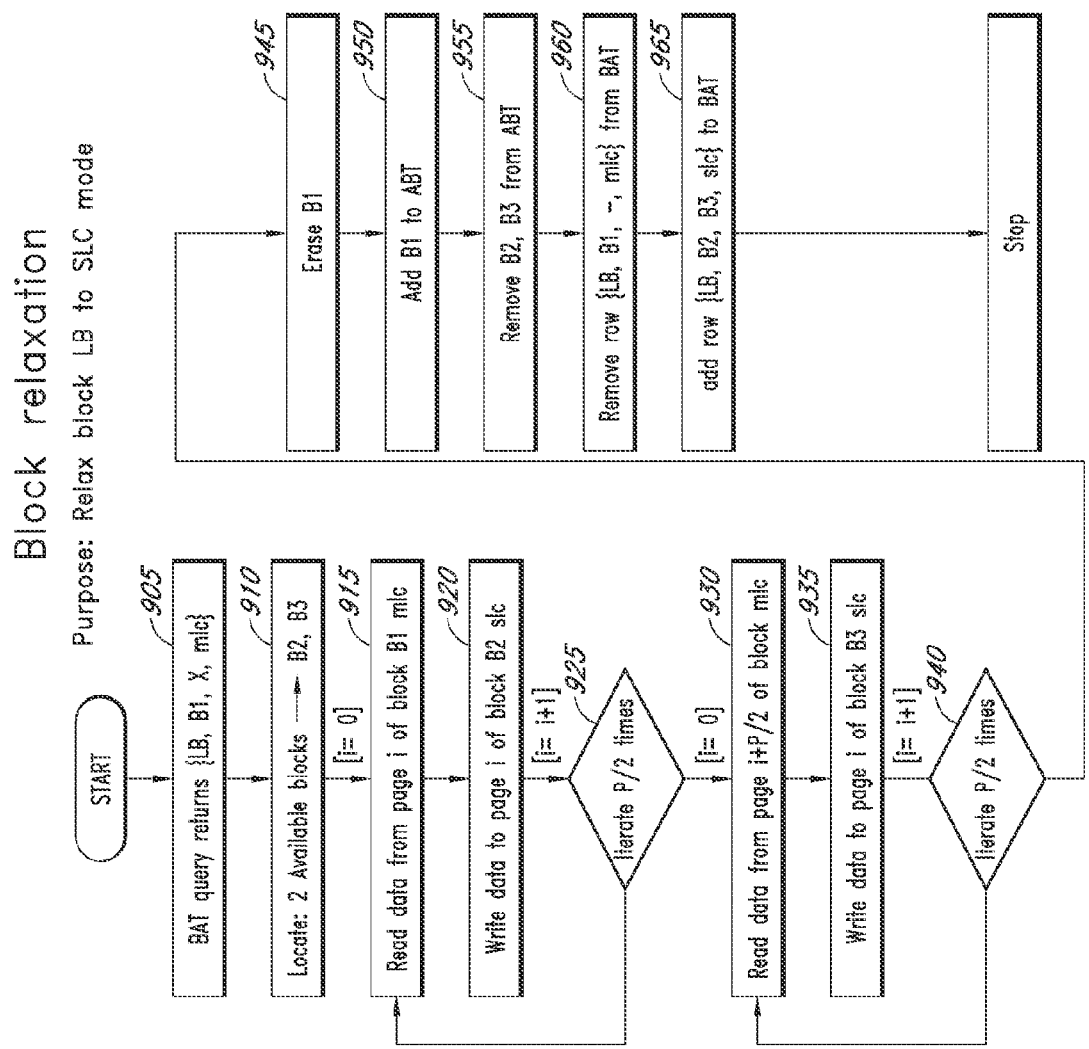
FIG. 9 illustrates a process of relaxing existing blocks from MLC mode to SLC mode.

FIG. 9 performs what can be considered an opposite procedure as FIG. 7, illustrating a process of relaxing existing blocks from SLC mode to MLC mode. It will be appreciated by the skilled practitioner that the illustrated process can be modified in a variety of ways. For example, in another embodiment, various portions of the illustrated process can be combined, can be rearranged in an alternate sequence, can be removed, or the like.

This relaxation algorithm can be run when there are blocks written in MLC, and the memory usage has become less than a threshold level. This re-programming is used to obtain the performance benefits of SLC mode when the memory usage is lower than a threshold. This procedure can take one two-level MLC block and spread the data into two one-bit SLC blocks. Like the process in FIG. 8, no information is lost, in this un-compacting of data.

The process begins at a state 905, where the process queries the block allocation table to locate a block B1 programmed in MLC mode. Proceeding to a state 910, the process searches for two available blocks B2 and B3 for the data from the MLC block B1. A loop counter i is initialized to zero. Next, the process in a state 915 reads data from page i of block B1. At a state 920, the process writes this data of page i to block B2 in SLC mode. At a decision block 925, the process controls iteration to P/2 writes, where P is the total number of pages in the logical block address corresponding to block B1. Like states 915-925, the process relaxes data from block B2 in states 930-940. The loop counter i is reset to zero. The process in state 930 reads data of page i from block B2. At state 935, the process writes data of page i to block B3 in SLC mode. At decision block 940, the process controls iteration P/2 times, where P is the total number of pages in the logical block address corresponding to block B1.

In a state 945, the process erases block B1. Then, the process adds an indication (e.g., row) of block B1 to the available blocks table in a state 950. Proceeding to a state 955, the process removes an indication (e.g., row) of blocks B2 and B3 from the available blocks table. At a state 960, the process removes the row with a logical block address corresponding to physical block B1 from the block allocation table. Next, at a state 965, the process adds a row for a logical block address corresponding to blocks B2 and B3 in SLC mode to the block allocation table. The process then ends.

FIG. 10 is an example of page read algorithm. It will be appreciated by the skilled practitioner that the illustrated process can be modified in a variety of ways. For example, in another embodiment, various portions of the illustrated process can be combined, can be rearranged in an alternate sequence, can be removed, or the like.

The process starts at a decision block 1010, the process determines if there is an allocated logical block with a page to be read. If not allocated, the process at state 1020 sets a flag to indicate that that page p is not allocated. In one embodiment, the flag is provided to the data cache. If the decision block 1010 determines that the logical block is allocated, then the process in decision block 1030 determines whether or not the logical block is in SLC mode. If not in SLC mode, then the process in state 1040 queries the physical block corresponding to B1. Next, in state 1050 the process reads page p on block B1 before the process ends. So in MLC mode, the process simply reads page p from the block.

Returning now to the decision block 1030, if the process determines that the block is in SLC mode, in the state 1060 the process retrieves the physical block address corresponding to blocks B1 or B2.

In the decision block 1070, the process determines which block, B1 or B2, is programmed with the page of data. If the page number p is greater than half the total number of pages P in a block, the process proceeds from the decision block 1070 to a state 1095 to read the page of data on the block B2 on page p—P/2. The process then ends. If the page number p is not greater than P/2, the process proceeds from the decision block 1070 to a state 1080 and reads the page of data on page p of block B1. After reading a page to block B1, the process then ends.

One embodiment is an apparatus comprising a flash memory having a number of memory blocks, wherein one or more of the memory blocks can operate in at least two modes of operation, the at least two modes of operation differing in a number of states to which a cell of a respective one of the blocks can be programmed and/or erased, and a controller configured to operate the one or more of the memory blocks in one of the two modes of operation based at least partly on at least one of an amount of the memory in use or available for use.

One embodiment is a method of allocating memory blocks within a flash memory, the method comprising receiving data to be programmed in the flash memory, dynamically allocating a block of memory cells as a block of single-level cells or a block of multi-level cells based at least partly on at least one of an amount of the memory already in use or an amount of the memory available for use, and programming the data into the allocated block.

One embodiment is a method of erasing data from a logical block, the method comprising determining a programming mode of an allocated block comprising data, erasing the data from the allocated block based on the programming mode, and adding an indication of the erased data to a table of available blocks.

One embodiment is a method of relaxing blocks from a multi-level cell mode to a single-level cell mode reading data from a block in multi-level cell mode, locating two available blocks, and writing data from the block in multi-level cell mode into the two available blocks in single-level cell mode.

Various embodiments have been described above. Although described with reference to these specific embodiments, the descriptions are intended to be illustrative and are not intended to be limiting. Various modifications and applications may occur to those skilled in the art without departing from the true spirit and scope of the invention as defined in the appended claims.

What is claimed is:

1. A method of erasing data associated with a logical block address, the method comprising:
   determining a programming mode associated with the logical block address, wherein the programming mode determines a number of physical memory blocks allocated to the logical block address for storing data, the number of physical memory blocks being one or more and wherein the programming mode comprises either a single-level cell mode or a multi-level cell mode;
   querying a block allocation table to determine a physical block address of the one or more physical memory blocks corresponding to the logical block address, wherein the block allocation table has one or more entries associating the logical block address to the physical block address of the physical memory blocks;

erasing the one or more physical memory blocks at the physical block address determined from the block allocation table; and clearing the one or more entries of the block allocation table.

2. The method of claim 1, further comprising adding the physical block address to one or more entries of an available blocks table responsive to said erasing.

3. The method of claim 1, wherein memory cells of the physical memory blocks are configured to store more than one bit per cell in the multi-level cell mode.

4. The method of claim 1, wherein a memory including the physical memory blocks is configured to dynamically switch between programming the physical memory blocks in the single-level cell mode and the multi-level cell mode.

5. The method of claim 1, wherein the physical address corresponds to two physical memory blocks in the single-level cell mode.

6. The method of claim 1, wherein more of the physical memory blocks are erased in the single-level cell mode than in the multi-level cell mode after said querying and prior to said clearing.

7. The method of claim 1, wherein the physical memory blocks comprise non-volatile memory cells.

8. The method of claim 1, wherein the physical memory blocks comprise flash memory cells.

9. The method of claim 1, wherein the physical memory blocks comprise NAND flash memory cells.

10. The method of claim 1, further comprising determining whether the logical block is allocated prior to determining the programming mode associated with the logical block address.

11. The method of claim 10, wherein the programming mode associated with the logical block address is determined when the logical block address is allocated, and wherein the method of erasing exits when the logical block address is not allocated.

12. An apparatus comprising:
physical memory blocks comprising non-volatile memory cells, the physical memory blocks configured to operate in a selected one of at least two programming modes, wherein the at least two programming modes determine a number of physical memory blocks allocated to a logical block address for storing data, the number of physical memory blocks being one or more, and the number of physical memory blocks being different for each of the at least two programming modes; and
a controller configured to:
determine a programming mode associated with the logical block address, wherein the programming mode is selected from the at least two programming modes;
query a block allocation table to determine a physical block address of the physical memory blocks corresponding to the logical block address, wherein the block allocation table has one or more entries associating the logical block address to the physical block address of the physical memory blocks;
erase the physical memory blocks at the physical block address determined from the block allocation table; and
clear the one or more entries of the block allocation table.

13. The apparatus of claim 12, wherein the non-volatile memory cells comprise flash memory cells.

14. The apparatus of claim 13, wherein the apparatus comprises at least one of a memory card, a digital camera, a digital audio device, or a USB storage device.

15. The apparatus of claim 12, wherein the controller is configured to add the physical block address to one or more entries of an available blocks table responsive to erasing the physical memory blocks at the physical block address.

16. The apparatus of claim 12, wherein the at least two programming modes comprise a single-level cell mode and a multi-level cell mode, wherein the number the of physical memory blocks is greater in the single-level cell mode than in the multi-level cell mode.

17. The apparatus of claim 12, wherein the controller is configured to operate the physical memory blocks in the selected one of the at least two programming modes based at least partly on an amount of memory in use.

18. A system comprising:
a flash memory array comprising physical memory blocks, the physical memory blocks configured to operate in a selected one of at least two programming modes, wherein the at least two programming modes determine a number of physical memory blocks allocated to a logical block address for storing data, the number of physical memory blocks being one or more, and the number of physical memory blocks being different for each of the at least two programming modes;
a controller configured to:
determine a programming mode associated with the logical block address, wherein the programming mode is selected from the at least two programming modes;
query a block allocation table to determine a physical block address of the physical memory blocks corresponding to the logical block address, wherein the block allocation table has one or more entries associating the logical block address to the physical block address of the physical memory blocks;
erase the physical memory blocks at the physical block address determined from the block allocation table; and
clear the one or more entries of the block allocation table; and
a host configured to issue at least one of a read operation or a program operation for the flash memory array, wherein the host is in communication with the controller.

19. The system of claim 18, wherein the host comprises one of a laptop computer, a digital audio player, a digital camera, a cell phone, or a video game console.

* * * * *